(12) United States Patent
Chu et al.

(10) Patent No.: US 8,972,832 B2
(45) Date of Patent: Mar. 3, 2015

(54) OPTIMIZED SCHEME AND ARCHITECTURE OF HARD DRIVE QUEUE DESIGN

(75) Inventors: Ngok Ning Chu, Los Altos, CA (US); Lei Chen, Sunnyvale, CA (US); Herjen Wang, Sunnyvale, CA (US); Johnson Yen, Fremont, CA (US)

(73) Assignee: LSI Corporation, San Jose, CA (US)

( * ) Notice: Subject to any disclaimer, the term of this patent is extended or adjusted under 35 U.S.C. 154(b) by 146 days.

(21) Appl. No.: 13/603,104

(22) Filed: Sep. 4, 2012

(65) Prior Publication Data

US 2014/0068389 A1  Mar. 6, 2014

(51) Int. Cl.
*H03M 13/00* (2006.01)
*H03M 13/45* (2006.01)
*H03M 13/11* (2006.01)
*H04L 1/00* (2006.01)

(52) U.S. Cl.
CPC ............ *H03M 13/45* (2013.01); *H04L 1/0054* (2013.01); *H03M 13/1154* (2013.01)
USPC ............ 714/780; 714/758; 714/752; 714/794

(58) Field of Classification Search
None
See application file for complete search history.

(56) References Cited

U.S. PATENT DOCUMENTS

| 7,607,073 | B1 | 10/2009 | Cheong et al. | |
|---|---|---|---|---|
| 2009/0273492 | A1* | 11/2009 | Yang et al. | 341/81 |
| 2010/0042906 | A1* | 2/2010 | Gunnam et al. | 714/780 |
| 2011/0161633 | A1* | 6/2011 | Xu et al. | 712/208 |
| 2011/0167227 | A1* | 7/2011 | Yang et al. | 711/154 |

* cited by examiner

*Primary Examiner* — John P Trimmings
(74) *Attorney, Agent, or Firm* — Suiter Swantz pc llo (57) ABSTRACT

Computer-implemented methods and systems may perform one or more operations including, but not limited to: receiving input data from a source; applying an interleaving protocol to the input data to generate at least one component codeword; decoding the at least one component codeword; determining a first convergence value of at least one decoded component codeword; computing extrinsic data associated with the at least one component codeword according to the bit error count and the first convergence of at least one component codeword; determining a second convergence value associated with the at least one component codeword according to the extrinsic data associated with the at least one component codeword.

21 Claims, 12 Drawing Sheets

|   |   |   |   |   |   |
|---|---|---|---|---|---|
|   | code .5k | | | code 118 | |
| 0 | | 16 | 16 | 16 | 16 |
| ⋮ | 64 | ⋮ | ⋮ | ⋮ | ⋮ |
| 26 | | 16 | 16 | 16 | 16 |
| 27 | | 16 | 16 | 16 | 16 |
| ⋮ | 64 | ⋮ | ⋮ | ⋮ | ⋮ |
| 80 | | 16 | 16 | 16 | 16 |

| Slot | 1 | 2 | 3 | 4 | 5 | 6 | 7 | 8 |
|---|---|---|---|---|---|---|---|---|
| Normal | LEQ read | NPCAL read RWI write | LEQ write | NCPLA read RWI read | NCPLA read RWI write | NCPLA read RWI write | LEH write | NCPLA read RWI write |

FIG. 4

| HDQ | CCW per CW | User symb | User bits | Parity | CW LEN (sym) | User rows per CCW | Parity rows per CCW | Row per CCW | Row per CW | .5k CW | 4k CW | Total rows | Width (bit) |
|---|---|---|---|---|---|---|---|---|---|---|---|---|---|
| u + p (code 118) | 4 | 4704 | 9408 | 1152 | 5208 | 25 | 3 | 28 | 112 | 44 | 6 | 672 | 384 |

FIG. 5

| | | | | |
|---|---|---|---|---|
| 0 | 384 | User Data | CCW0 | CW0 |
| ... | 384 | | | |
| 24 | 384 | | | |
| 25 | 384 | Parity Data | | |
| 26 | 384 | | | |
| 27 | 384 | | | |
| 28 | 384 | User Data | CCW1 | |
| ... | 384 | | | |
| 52 | 384 | | | |
| 53 | 384 | Parity Data | | |
| 54 | 384 | | | |
| 55 | 384 | | | |
| 56 | 384 | User Data | CCW2 | |
| ... | 384 | | | |
| 80 | 384 | | | |
| 81 | 384 | Parity Data | | |
| 82 | 384 | | | |
| 83 | 384 | | | |
| 84 | 384 | User Data | CCW3 | |
| ... | 384 | | | |
| 108 | 384 | | | |
| 109 | 384 | Parity Data | | |
| 110 | 384 | | | |
| 111 | 384 | | | |
| ... | ... | ... | ... | ... |
| 560 | 384 | User Data | CCW0 | CW5 |
| ... | 384 | | | |
| 584 | 384 | | | |
| 585 | 384 | Parity Data | | |
| 586 | 384 | | | |
| 587 | 384 | | | |
| 588 | 384 | User Data | CCW1 | |
| ... | 384 | | | |
| 612 | 384 | | | |
| 613 | 384 | Parity Data | | |
| 614 | 384 | | | |
| 615 | 384 | | | |
| 616 | 384 | User Data | CCW2 | |
| ... | 384 | | | |
| 640 | 384 | | | |
| 641 | 384 | Parity Data | | |
| 642 | 384 | | | |
| 643 | 384 | | | |
| 644 | 384 | User Data | CCW3 | |
| ... | 384 | | | |
| 668 | 384 | | | |
| 669 | 384 | Parity Data | | |
| 670 | 384 | | | |
| 671 | 384 | | | |

| Data buf (128) | HDQ addr | Next HDQ addr | 128 wide | | | | | |
|---|---|---|---|---|---|---|---|---|
| ccw0 | 0 | 1 | 379:378 | ... | 19:18 | 13:12 | 7:6 | 1:0 |
| ccw1 | 54 | 55 | 379:378 | ... | 19:18 | 13:12 | 7:6 | 1:0 |
| ccw2 | 108 | 109 | 379:378 | ... | 19:18 | 13:12 | 7:6 | 1:0 |
| ccw3 | 162 | 163 | 379:378 | ... | 19:18 | 13:12 | 7:6 | 1:0 |

FIG. 8A

| Data buf (128) | HDQ addr | Next HDQ addr | 128 wide | | | | | |
|---|---|---|---|---|---|---|---|---|
| ccw0 | 0 | 1 | 381:380 | ... | 21:20 | 15:14 | 9:8 | 3:2 |
| ccw1 | 54 | 55 | 381:380 | ... | 21:20 | 15:14 | 9:8 | 3:2 |
| ccw2 | 108 | 109 | 381:380 | ... | 21:20 | 15:14 | 9:8 | 3:2 |
| ccw3 | 162 | 163 | 381:380 | ... | 21:20 | 15:14 | 9:8 | 3:2 |

FIG. 8B

| Data buf (128) | HDQ addr | Next HDQ addr | 128 wide | | | | | |
|---|---|---|---|---|---|---|---|---|
| ccw0 | 0 | 1 | 383:382 | ... | 23:22 | 17:16 | 11:10 | 5:4 |
| ccw1 | 54 | 55 | 383:382 | ... | 23:22 | 17:16 | 11:10 | 5:4 |
| ccw2 | 108 | 109 | 383:382 | ... | 23:22 | 17:16 | 11:10 | 5:4 |
| ccw3 | 162 | 163 | 383:382 | ... | 23:22 | 17:16 | 11:10 | 5:4 |

FIG. 8C

| Parity buf (128) | HDQ addr | Next HDQ addr | 128 wide | | | | | |
|---|---|---|---|---|---|---|---|---|
| ccw0 | 48 | 49 | 379:378 | ... | 19:18 | 13:12 | 7:6 | 1:0 |
| ccw1 | 102 | 103 | 379:378 | ... | 19:18 | 13:12 | 7:6 | 1:0 |
| ccw2 | 156 | 157 | 379:378 | ... | 19:18 | 13:12 | 7:6 | 1:0 |
| ccw3 | 210 | 211 | 379:378 | ... | 19:18 | 13:12 | 7:6 | 1:0 |

FIG. 8D

| Parity buf (128) | HDQ addr | Next HDQ addr | 128 wide | | | | | |
|---|---|---|---|---|---|---|---|---|
| ccw0 | 48 | 49 | 381:380 | ... | 21:20 | 15:14 | 9:8 | 3:2 |
| ccw1 | 102 | 103 | 381:380 | ... | 21:20 | 15:14 | 9:8 | 3:2 |
| ccw2 | 156 | 157 | 381:380 | ... | 21:20 | 15:14 | 9:8 | 3:2 |
| ccw3 | 210 | 211 | 381:380 | ... | 21:20 | 15:14 | 9:8 | 3:2 |

FIG. 8E

| Parity buf (128) | HDQ addr | Next HDQ addr | 128 wide | | | | | |
|---|---|---|---|---|---|---|---|---|
| ccw0 | 48 | 49 | 383:382 | ... | 23:22 | 17:16 | 11:10 | 5:4 |
| ccw1 | 102 | 103 | 383:382 | ... | 23:22 | 17:16 | 11:10 | 5:4 |
| ccw2 | 156 | 157 | 383:382 | ... | 23:22 | 17:16 | 11:10 | 5:4 |
| ccw3 | 210 | 211 | 383:382 | ... | 23:22 | 17:16 | 11:10 | 5:4 |

FIG. 8F

Normal Mode

| ccw: | 0 | 0 | 2 | 0 | 2 | 0 | 2 | 0 | 2 | 0 | 2 | 0 | 2 | 0 | 2 | 0 | 2 | 0 | 2 | 0 | 2 | ... |
|---|---|---|---|---|---|---|---|---|---|---|---|---|---|---|---|---|---|---|---|---|---|---|
| hdq_rwi_data[1:0] | P | U | U | U | U | U | U | U | U | U | U | U | U | U | U | U | U | U | U | U | P | ... |
| hdq_rwi_data[3:2] | P | U | U | U | U | U | P | P | U | U | U | U | U | U | U | U | U | U | U | U | P | ... |
| ccw: | 1 | 1 | 3 | 1 | 3 | 1 | 3 | 1 | 3 | 1 | 3 | 1 | 3 | 1 | 3 | 1 | 3 | 1 | 3 | 1 | 3 | ... |

FIG. 9A

Code 118 MTR Mode

| ccw: | 0 | 2 | 0 | 2 | 0 | 2 | 0 | 2 | 0 | 2 | 0 | 2 | 0 | 2 | 0 | 2 | 0 | 2 | 0 | 2 | 0 |
|---|---|---|---|---|---|---|---|---|---|---|---|---|---|---|---|---|---|---|---|---|---|
| hdq_rwi_data[1:0] | P | P | P | P | P | P | U | U | U | U | U | U | U | U | U | ... | U | U | P | P | P |
| hdq_rwi_data[3:2] | P | P | P | P | P | P | U | U | U | U | U | U | U | U | U | ... | U | U | P | P | P |
| ccw: | 1 | 3 | 1 | 3 | 1 | 3 | 1 | 3 | 1 | 3 | 1 | 3 | 1 | 3 | 1 | 3 | 1 | 3 | 1 | 3 | 1 |

FIG. 9B

| bit range | | frag numb dual_sm_en =1 | frag numb dual_sm_en =0 | Definition |
|---|---|---|---|---|
| 114 | 112 | 7 max | 8 max | Number of fragments: 0: 1 fragment ... 7: 8 fragment |
| 111 | 98 | -- | 7 | frag size |
| 97 | 84 | 6 | 6 | frag size |
| 83 | 70 | 5 | 5 | frag size |
| 69 | 56 | 4 | 4 | frag size |
| 55 | 42 | 3 | 3 | frag size |
| 41 | 28 | 2 | 2 | frag size |
| 27 | 14 | 1 | 1 | frag size |
| 13 | 0 | 0 | 0 | frag size |

FIG. 10

OPTIMIZED SCHEME AND ARCHITECTURE OF HARD DRIVE QUEUE DESIGN

BACKGROUND

Hard decision decoding takes a stream of bits from a "threshold detector" stage of a receiver, where each bit is considered definitely "1" or "0." For example, for binary signaling, received pulses are sampled and the resulting voltages are compared with a single threshold. If a voltage is greater than the threshold it is considered to be definitely a "1" regardless of how close it is to the threshold. If it is less than the threshold value, it is considered to be definitely a "0."

Soft decision decoding requires a stream of "soft" bits including the "1" or "0" hard decision as well as "confidence" bits providing an indication of the certainty that decision is correct.

An exemplary mechanism for implementing soft decision decoding would be to configure a threshold detector to generate as follows: 000 (definitely 0), 001 (probably 0), 010 (maybe 0), 011 (guess 0), 100 (guess 1), 101 (maybe 1), 110 (probably 1), 111(definitely 1). Where the first bit is the "hard" decision bit and the two bits may be considered to a "confidence" bits with regard to the certainty that the "hard" decision bit has been correctly detected.

SUMMARY

In a data read channel, a hard decision de-interleaver (HD-DLV) may take interleaved hard decision data from log likelihood ratio data/extrinsic data (LE) memory, perform local de-interleaving, and send the de-interleaved data to a hard decision queue buffer (HDQ). The HDQ may store hard decision data from the LEH memory (de-interleaved) and transfer hard decision data to a read/write interface (RWI) module. For a 4 k sector, HDQ does partial de-interleaving as data is being read out of the HDQ. HDQ may send out hard decision data to a noise-predictive calculation (NPCAL) function.

An optimized scheme and architecture of HDQ design is proposed. HDQ stores hard decisions from LEH (de-interleaved) memory and transfers hard decision to RWI module. For 4 k sector, HDQ does partial de-interleaving as data being read out of HDQ. HDQ sends out hard decision data to NPCAL function. HDQ has 5 clients: (1) RWI reads 4 b/quarter clock period (ckq) (4 user+4 parity); (2) LEH writes 48 b/octal clock period (cko); (3) LE LN data write 48 b/cko; 4) Saved LE read 48 b/cko; (5) NPCAL read 4 b/ckq (4 user+4 parity). HDQ supports error bit count feature: HDQ compares detectors data with decoder (DEC) output and adds up all mismatch bits. The HDQ outputs fragment flag using "hdq_c-md_frag_in" and "cw_length". HDQ outputs fragment $2^{nd}$ sm flag using "sync mark length" and "dual_en". HDQ supports raw data mode: HDQ outputs both parity and user data.

BRIEF DESCRIPTION OF DRAWINGS

The numerous advantages of the disclosure may be better understood by those skilled in the art by referencing the accompanying figures in which.

DETAILED DESCRIPTION

Figure 1:
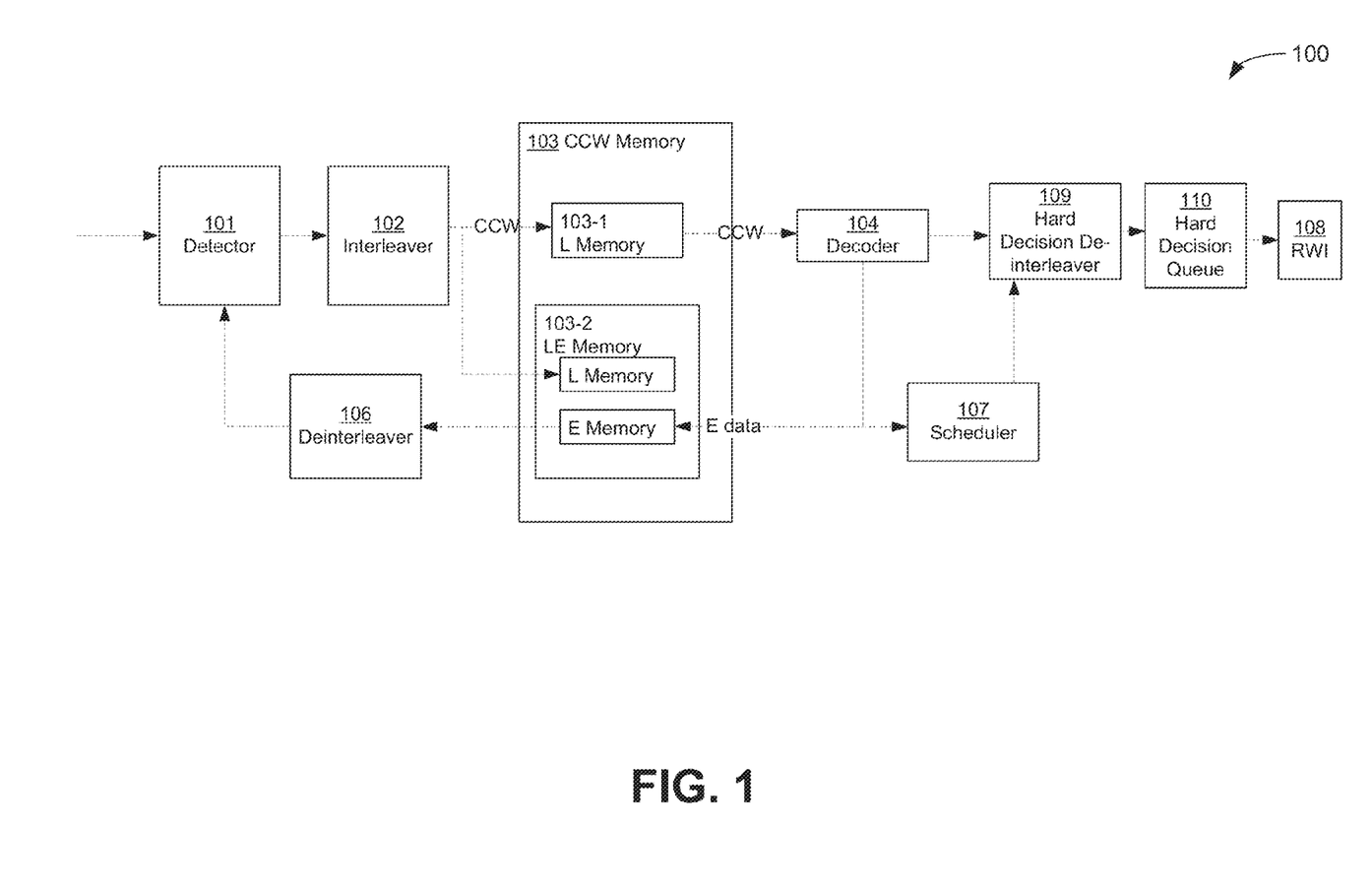
FIG. 1 shows an HDQ system.

Referring to FIG. 1, a system 100 for hard-decision decoding is shown. The system 100 may receive input data from a source at a detector 101. The detector 101 may provide the input data to an interleaver 102. The interleaver 102 may interleave the input data according to a given interleaving scheme to form at least one soft-decision component codeword (CCW) which may be stored to a CCW memory 103.

The CCW memory 103 may include an L memory partition 103-1 and an LE memory partition 103-2. The L memory partition 103-1 may store at least one CCW including log likelihood ratio data (L data) received from the interleaver. The L memory partition 103-1 may be a 0.5 k sector or a 4 k sector. For a 0.5 k sector, one sector includes one codeword. For the 4 k sector, one sector is one codeword composed of 4 CCWs (i.e. 1 sector is equal to 4 CCWs).

Following storage of at least one CCW to the L memory partition 103-1, the CCW may be provided to a decoder 104. The decoder 104 may decode the CCW according to a decoding scheme (e.g. a low-density priority check (LDPC) decoding scheme) and determine a convergence of the CCW (e.g. by comparison of a decoder converge signal to a threshold convergence value). Detection of a convergence of the CCW may be indicative that the "hard" decision component of a "soft" decision CCW has been likely been correctly determined and may be suitable for computations by a read/write interface 105 (RWI).

Specifically, if a decoder converge signal is high, it may be indicative that a current CCW has converged. For 0.5 k sector, because this sector is inherently converged, the decoded hard decision data associated with the CCW may be passed to the HDQ. For 4 k sector, only when all four CCWs of one sector are all converged can the hard decision data associated with the CCW may be passed to the HDQ. If one or more CCWs have not converged, extrinsic data (E data) (i.e. error in the output of the decoder 104 minus error in the input data) may be employed to facilitate convergence.

The E data may be provided to a local de-interleaver 106 that may interleave the E data according to the given interleaving scheme. The de-interleaved E data may be provided to the detector 101 thereby by completing a first convergence iteration for the CCW. The system 100 may carry out additional convergence operations as described above with respect to the E data until the E data reaches a given convergence threshold or the system 100 completes a threshold number of convergence iterations as determined by a scheduler 107. Detection of a convergence of the CCW may be indicative that the "hard" decision component of a "soft" decision CCW has been likely been correctly determined and may be suitable for computations by a read/write interface 108 (RWI).

Upon reaching the convergence threshold or the iteration threshold maintained by the scheduler 107, the scheduler 107 may signal a hard-decision de-interleaver 109 (HDDLV) to query the decoder 104 to obtain the decoded CCW. Upon receipt of such a signal, the hard-decision de-interleaver 109 may de-interleave the decoded CCW according to the given interleaving scheme and provide the de-interleaved decoded CCW to a hard-decision queue 110 (HDQ). Once all CCW of a given data sector have converged to a likely "hard" decision value and been stored to the hard-decision queue 110, the hard-decision queue 110 may provide the data sector to the read/write interface 108 for further processing.

Figure 2:
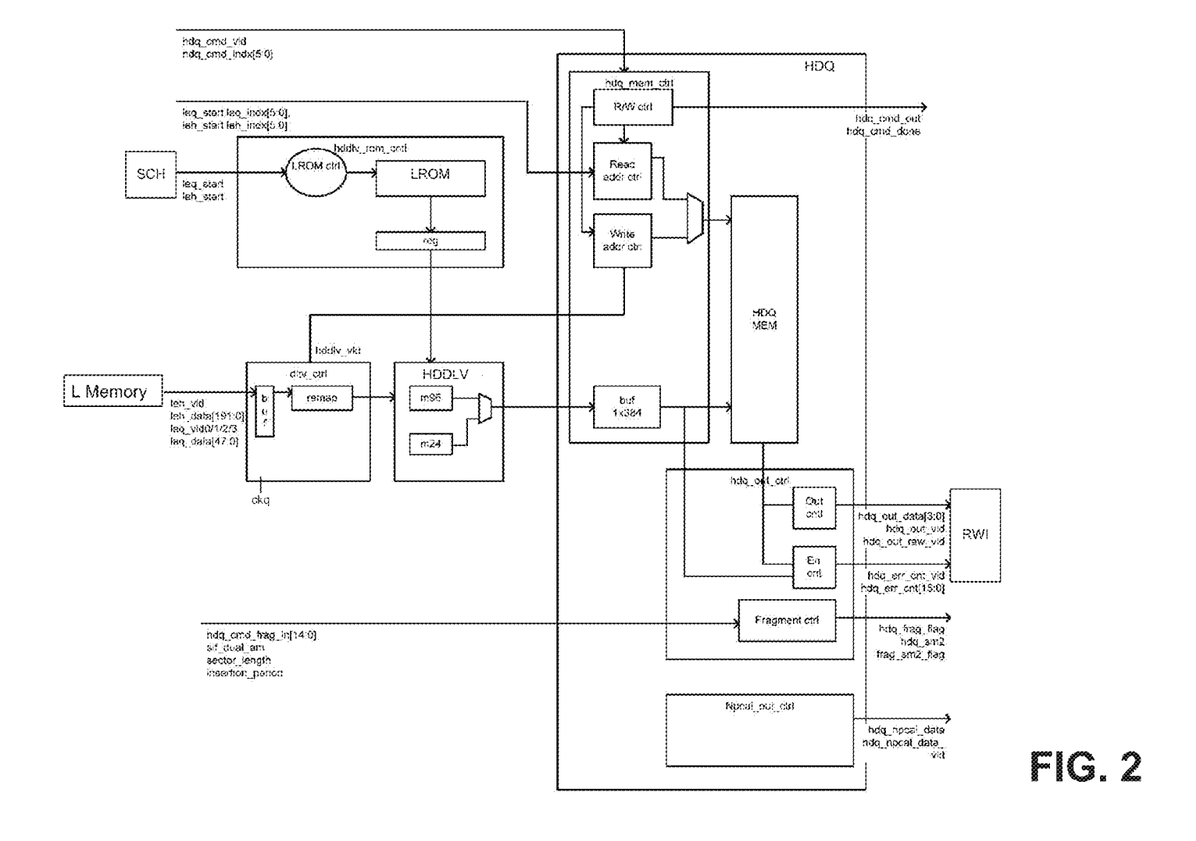
FIG. 2 shows an HDQ system.
Figure 2A:
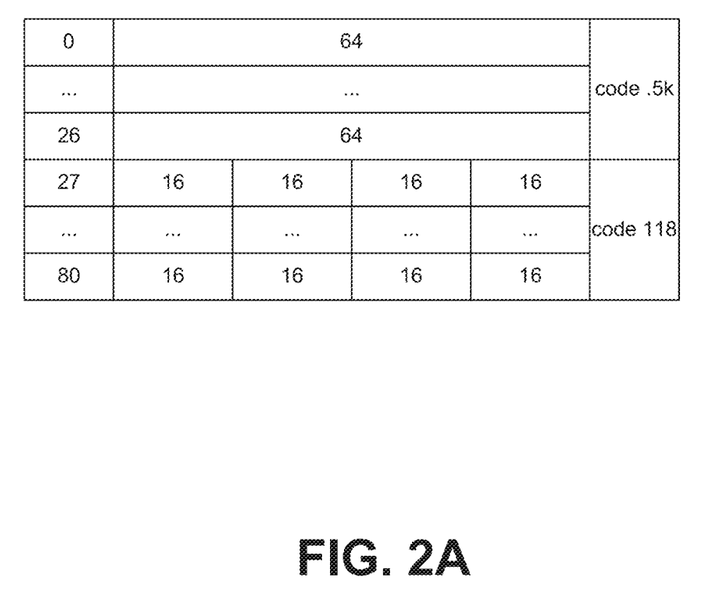
FIG. 2A shows a exemplary LROM memory structure.

Referring to FIG. 2 and FIG. 2A, a more detailed illustration of system 100 is shown in FIG. 2. The system 100 may include an HDDLV. The HDDLV may further include an interleaver ROM table (L-ROM) (81×64) running at an octal clock rate and configured for storing local mappings for code 118. In the HDDLV, each local mapping applies to a 96 bit chunk for 0.5 k sector and 24 bit chunk for 4 k sector. An exemplary memory structure for the LROM associated with the HDDLV is shown in FIG. 2A. Code 118 may be used for the 4 k sector. For the 4 k sector, each entry may have 4 local mappings and is used for one circulant.

Figure 3:
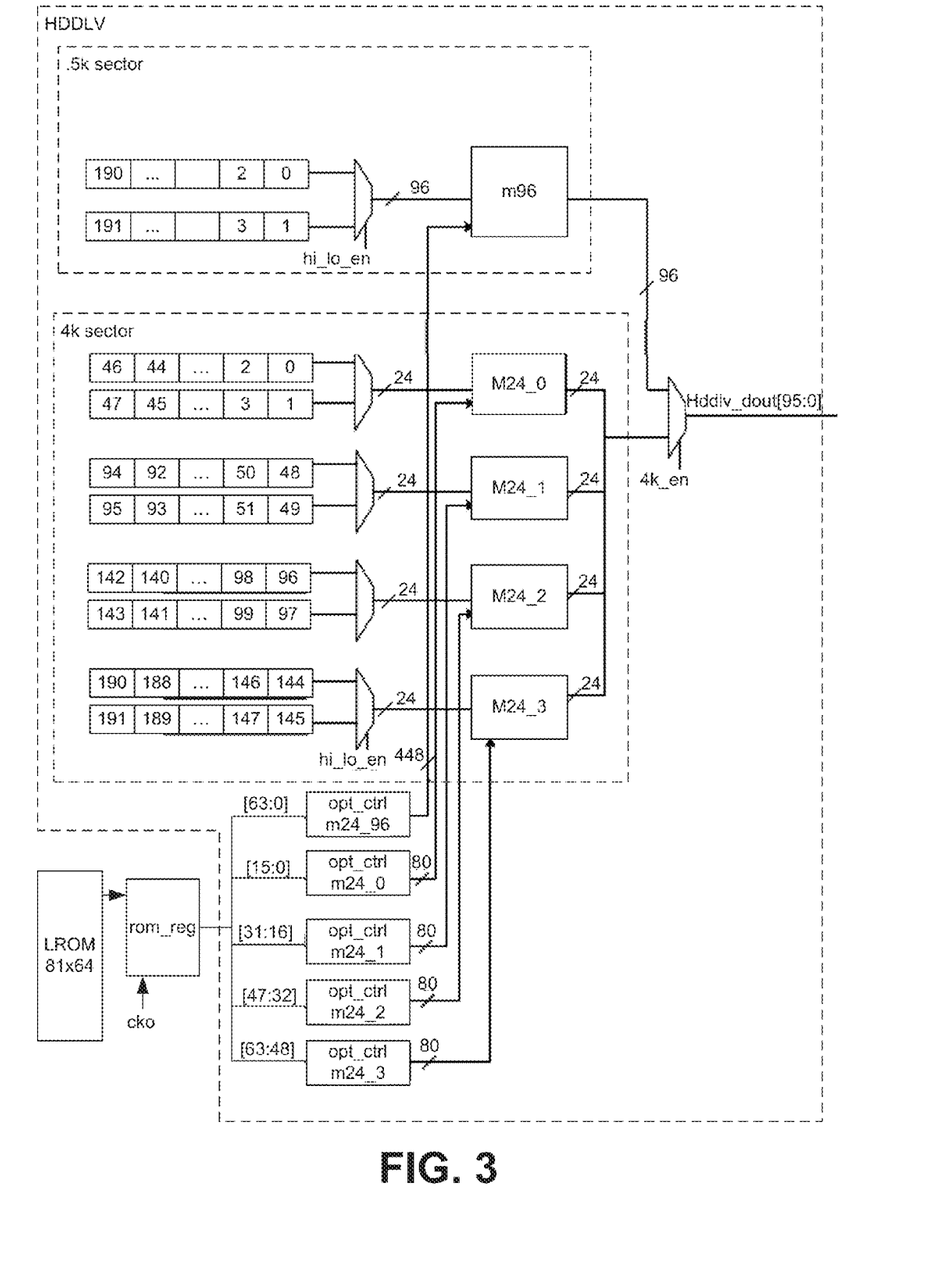
FIG. 3 shows and HHDLV.

Referring again to FIG. 2, once a CCW converges/is detected, a scheduler (SCH) sends a start signal (i.e. leh_start/ leq_start) to trigger a start of CCW transfer from an L Memory to the HDQ. From this trigger, the HDDLV fetches local mappings from the LROM. The L Memory sends 96 symbols (192 hard decision bits) as leh_vld from a 4 k sector at the octal rate clock rate (cko) to the HDDLV. The LMemory may further sends 24 symbols (48 hard decision bits) as leq_vld from a 0.5 k sector on the quarter octal clock rate (ckq) to the HDDLV. The HDDLV may transmit 192 bit packets to the HDQ. Each LROM entry has 4 local mappings (16 bits each) for the 96 symbols. Each local mapping is for 24 symbols. In the 192 bit chunk (96 symbols), first 48 least significant bits (lsb) will use the first 16 (lsb) bits local mapping from a given LROM entry (64 bits). Since the local mapping will include 24 bits, two sets of 24 bits having the same local mapping will result. To de-interleave 192 bits, 8 de-interleavers will be needed. However, to reduce gate count when timing is not critical, de-interleaving can be carried out in two octal clock cycles. With this, only 4 de-interleavers may be needed. Referring to FIG. 3, the data path and its local de-interleaver mapping is shown.

Referring again to FIG. 2, the HDQ may save de-interleaved data when the CCW converges and save the CCW from the first iteration for error bit counting. The HDQ saves a local interleaving value from a local interleaver (e.g. interleaver 102 of FIG. 1) and then may be used to compare with interleaved HDQ data. The HDQ memory bandwidth may have 5 clients: (1) RWI read at 4 b/ckq; (2) CCW 0.5 k sector write at 24 b/ckq; (3) CCW 4 k sector write at 24 b/ckq; (4) Saved CCW read at 24 b/ckq; and (5) NPCAL read at 4 b/ckq.

To maintain this memory bandwidth, for the memory using single port memory, the HDQ may use time division multiplexing (TDM) scheme to allocate bandwidth to all the clients. The CCW write data and may share a first-in-first-out (FIFO) queue and TDM write slots. When bit error counting is enabled, an extra LEQ read cycle may be needed to fetch the detector data. That data may be compared with the decoder data to generate a bit error count.

Figure 4:
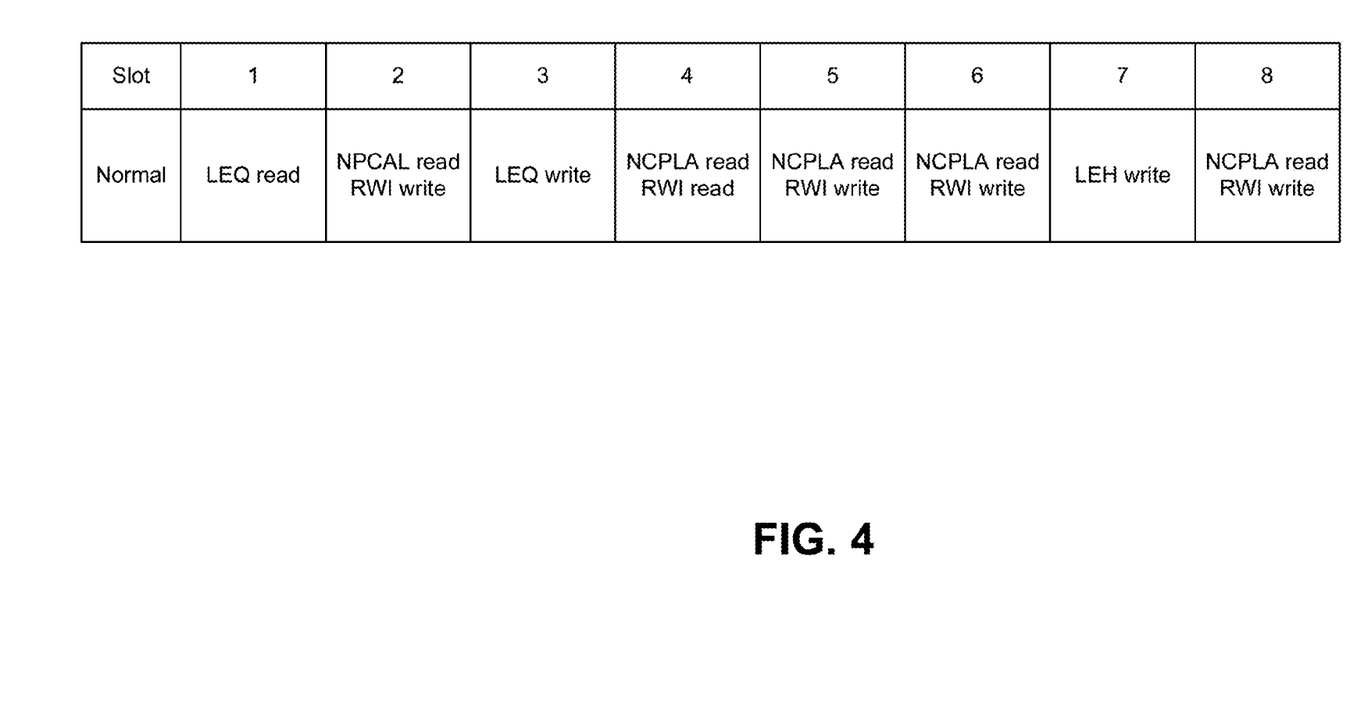
FIG. 4 shows a TDMA frame.

FIG. 4 shows an exemplary TDM scheme for allocation of bandwidth. The various access rates for the noted operations may be: NPCAL read—384×2.5/8=140 b/cko=70 b/ckq; RWE read—384×2.5/8=140 b/cko=70 b/ckq; LEQ read=384×⅛=48 b/cko; LEH write—384×⅛=48 b/cko; and LEQ write—384×⅛=48 b/cko.

Bandwidth calculations may be as follows. The RWI may have 128 bit ping, pong and tail buffers: 128 b×2 b/cko=64 cko. Within 64 cko, the LEQ and LEH may use: 3×(64/8)+ 3=27 cko. As such there are 64−27=37 slots for RWI and NPCAL reads. To send data to NPCAL, HDQ needs 8 slots to read 4 data and 4 parity. It may be the case that 37 slots for RWI and NPCAL reads is greater than 8 data+8 parity+(4 tail×2)=24 slots.

To send data to the NPCAL, HDQ needs 8 slots to read 4 data and 4 parity. In the worst case, within 16 slots, LEQ and LEH consumes 8 slots, NPCAL uses 8 slots. We set the maximum latency for NPCAL to 20 slots which is 40 ckq.

Figure 5:
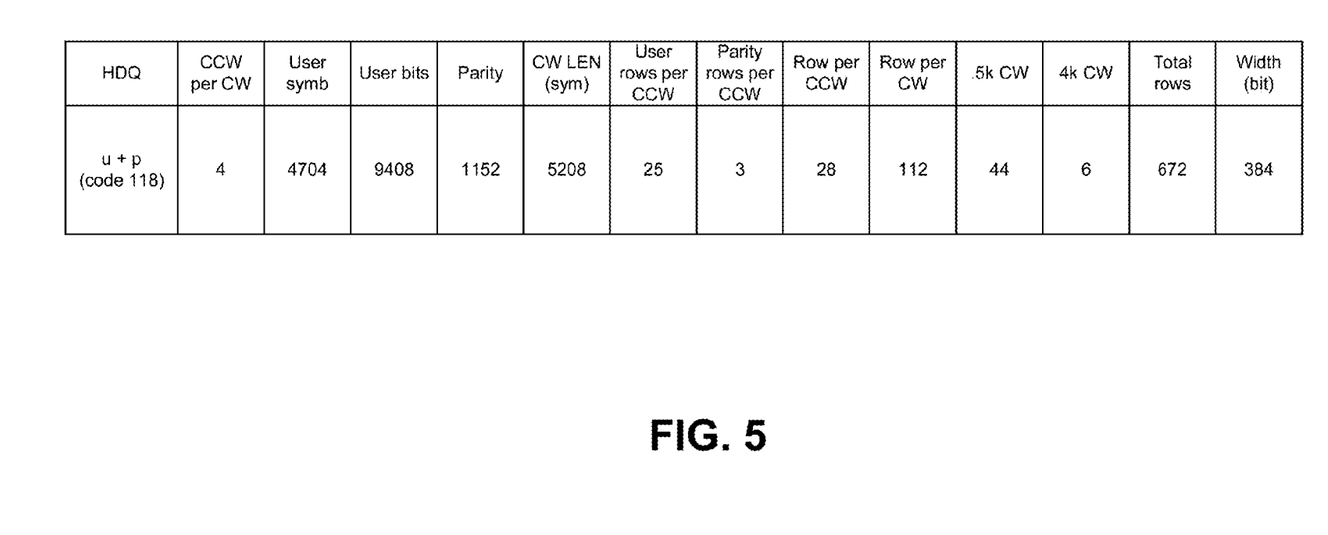
FIG. 5 shows an exemplary memory structure for an HDQ.
Figure 6:
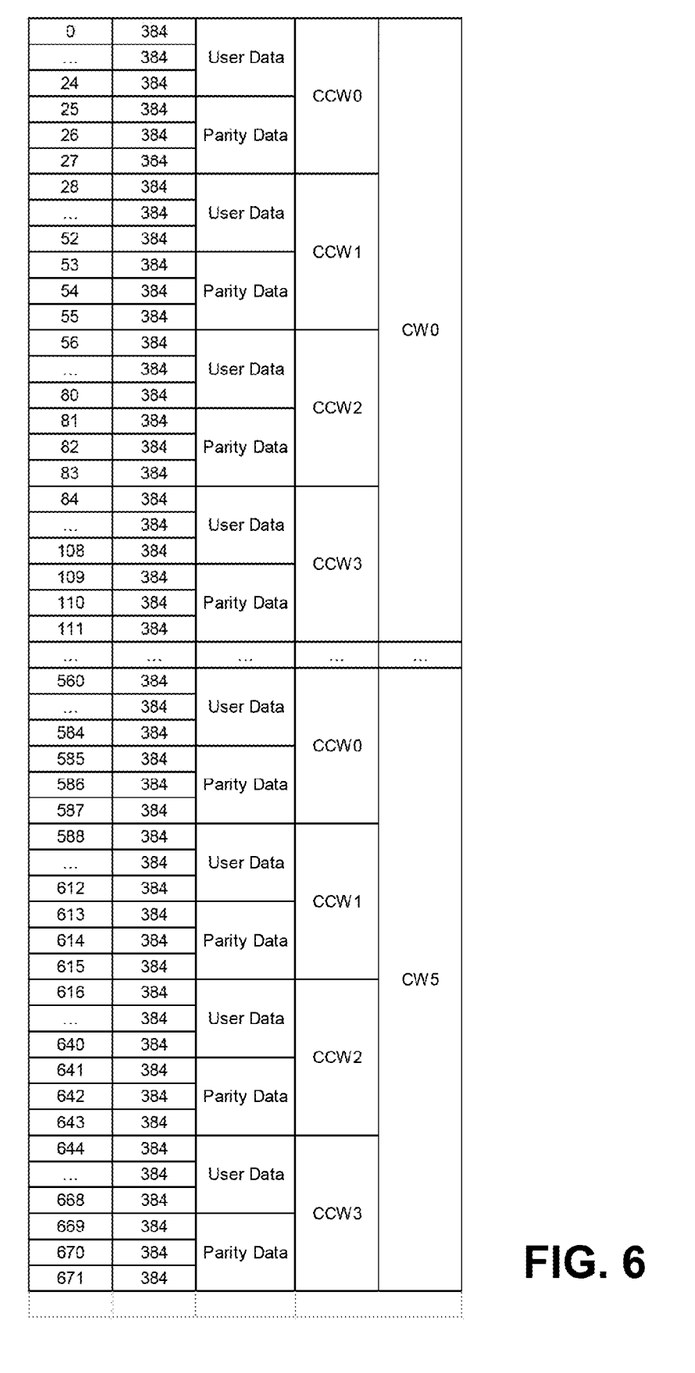
FIG. 6 shows an exemplary memory content example for user and parity data.
Figure 7:
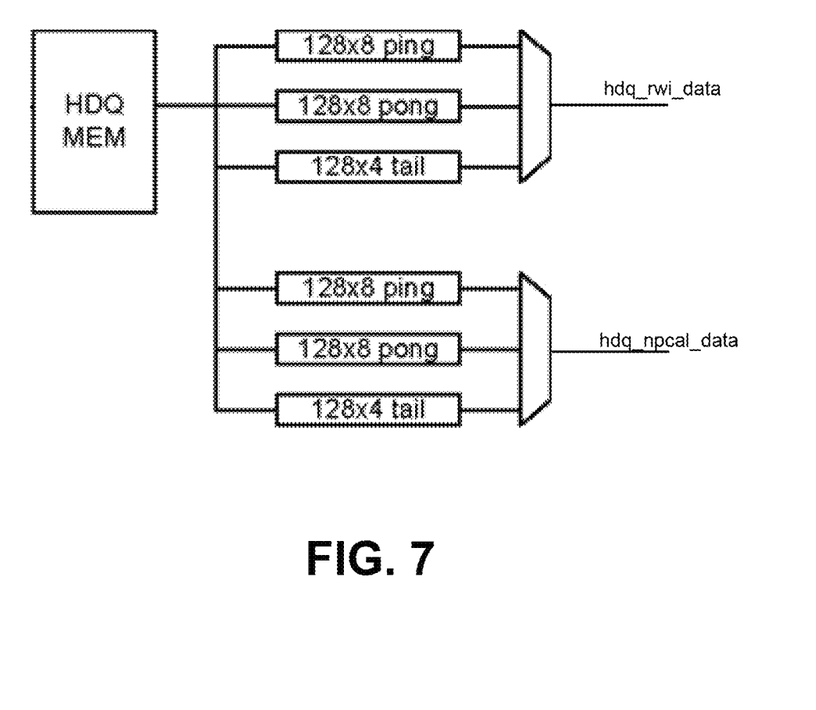
FIG. 7 shows HDQ data output controller logic.

Referring to FIG. 5 an exemplary memory structure for the HDQ is shown. The HDQ may store up to 40.5 k CW (user and parity) or 48.5 k CW (user only) and up to 54 k CW (user and parity) or 64 k CW (user only). Referring to FIG. 6, an exemplary memory content example for user and parity for code 118 is shown.

Referring to FIG. 2, an HDQ data output controller logic for providing data to the RWI and the NPCAL is shown. It may be the case that the RWI and NPCAL cannot share the same data path. As such, the HDQ data out logic may include 2 sets of an identical data path. For 4 KB sector 4-way de-interleaving, the HDQ may need to buffer up 4 CCW for user data and 4 CCW for parity. To compensate for the bandwidth lost at the end of a sector. A ping-pong buffer and a tail buffer may be used to reduce the gap in back-to-back sectors. The ping-pong buffer may pre-fetch the data, and the tail buffer may pre-fetch the tail (last line of each CCW).

To minimize the latency of the RWI data, various approaches have been identified. A command queue may be implemented in the HDQ such that when this queue is not full, the SCH can send a command to this queue. When the command queue is not empty the HDQ can pre-fetch user data and parity data after it has done with a current CW. Further, a full 128 bit-wide ping-pong buffer and a full 128 bit wide tail buffer may be used in HDQ out data path.

Figure 8A:
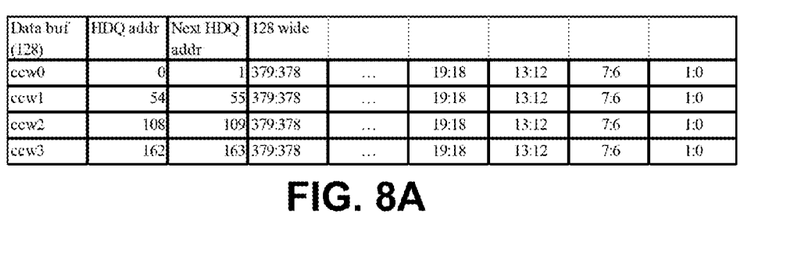
FIGS. 8A-8F show an HDQ data output controller logic for providing data to the RWI and the NPCAL.
Figure 8B:
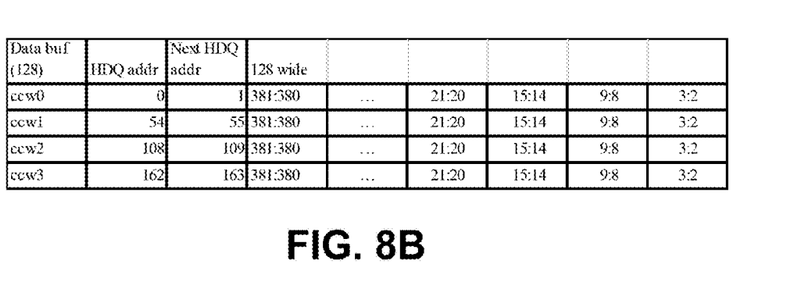
Figure 8C:
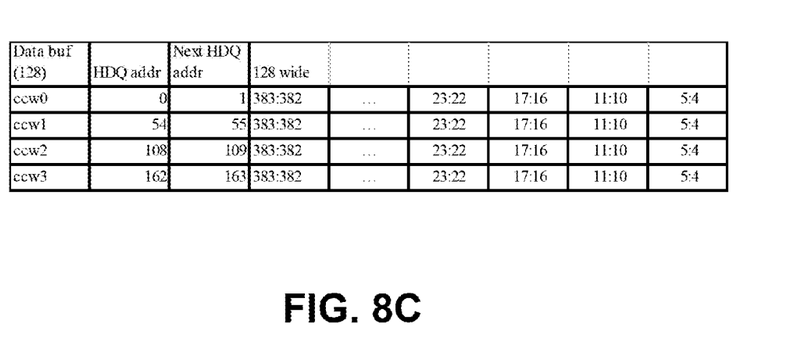
Figure 8D:
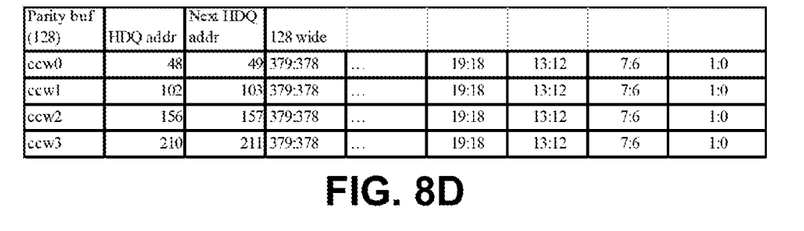
Figure 8E:
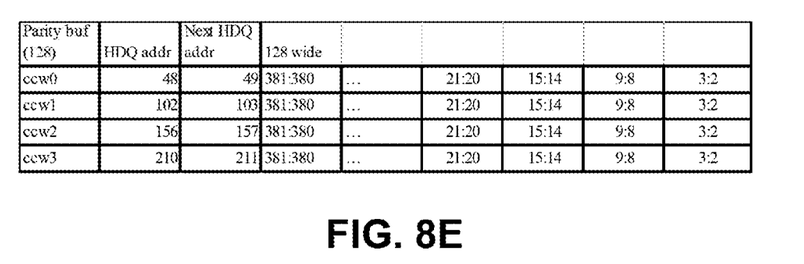
Figure 8F:
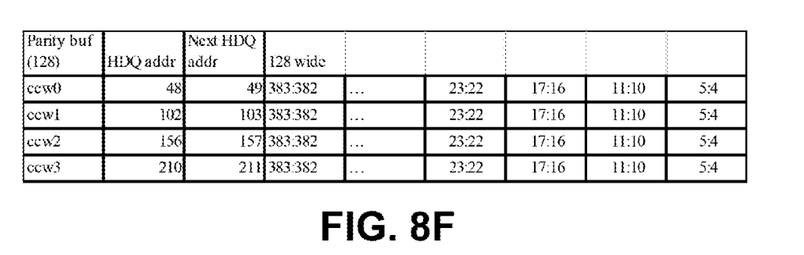

FIG. 8F show the content of the data buffers and the parity buffers for chunks 1-3, respectively, after it has been read out from the HDQ memory.

Figure 9A:
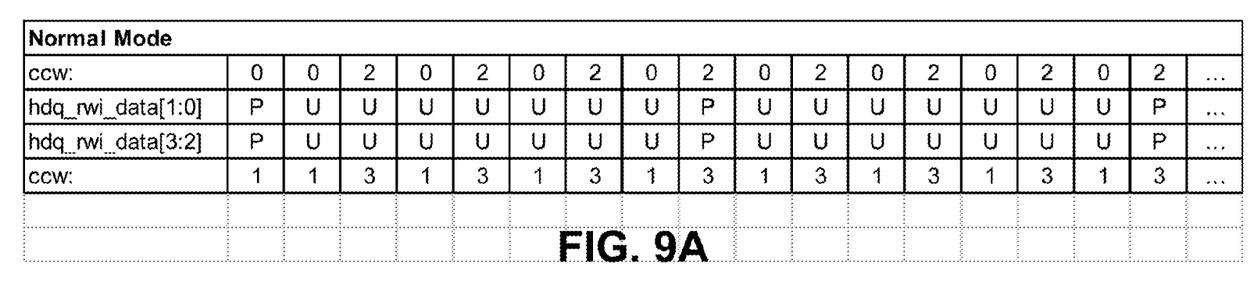
FIGS. 9A-9B show content of data buffers and parity buffers.
Figure 9B:
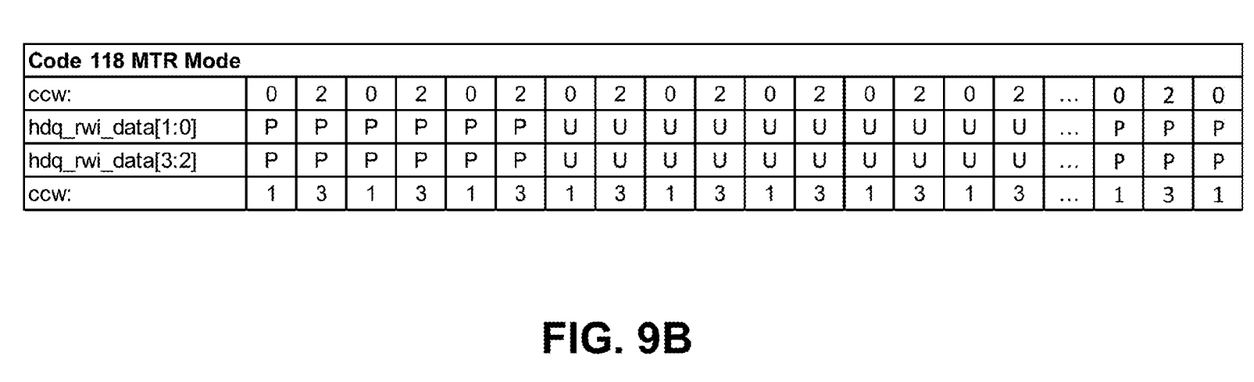

Referring to FIG. 9A, an HDQ output stream example for code 118, normal mode is shown. Referring to FIG. 9B, an HDQ output stream example for code 118, MTR mode is shown.

An SCH sends leh_index, leq_index, leh_start and leq_start signals to initation a start of a CCW transfer from the LEH/LEQ to the HDDLV and on to the HDQ. The HDDLV may use the leh_index, leq_index, leh_start and leq_start signals to fetch the first LROM entry. For LEQ data and LEH data to share the same local de-interleaver HDDLV they must be 2 octal clock periods apart.

The HDDLV may process the 192 bit data in 2 cko. The HDDLV may then send on a 96 bit data chunk to the HDQ in 1 cko. The HDQ may save all data and start sending out a given sector when the SCH sends a hdq_cmd_vld signal. When the HDQ receives the "hdq_cmd_vld" signal along with an "hdq_cmd_index" value, the HDQ may calculate the read address and fragment size and begin sending data to the RWI.

Figure 10:
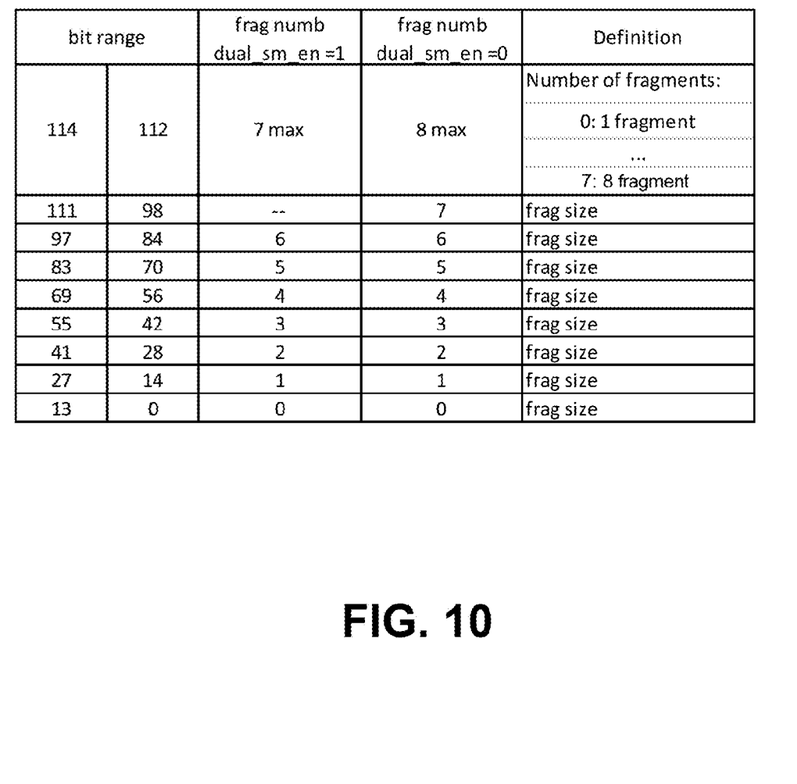
FIG. 10 shows fragment information for an entire sector.

A scheduler may trigger the start of a sector transfer by sending hdq_cmd_vld. At the same time, SCH also sends hdq_cmdfrag_in[114:0] which contains fragment information for an entire sector. A maximum number of fragments in a sector may be 8.

The hdq_cmd_frag_in may be defined as presented in Error! Reference source not found. In the case where a dual sync mark is enabled, each original fragment may be split into two intermediate fragments. Therefore, there may be a total of 14 intermediate fragments split as follows:

If frag_in[13:0]≤sif_sm_sep, then Frag_a=frag_in[13: 0] and Frag_b=0

If frag_in[13:0]>sif_sm_sep, then Frag_a=sif_sm_sep and Frag_b=frag_in[13:0]−sif_sm_sep It is believed that the present invention and many of its attendant advantages will be understood by the foregoing description. It may be also believed that it will be apparent that various changes may be made in the form, construction and arrangement of the components thereof without departing from the scope and spirit of the invention or without sacrificing all of its material advantages. The form herein before described being merely an explanatory embodiment thereof. It may be the intention of the following claims to encompass and include such changes.

The foregoing detailed description may include set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure.

In addition, those skilled in the art will appreciate that the mechanisms of the subject matter described herein may be capable of being distributed as a program product in a variety of forms, and that an illustrative embodiment of the subject matter described herein applies regardless of the particular type of signal bearing medium used to actually carry out the distribution. Examples of a signal bearing medium include, but may be not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

Those having skill in the art will recognize that the state of the art has progressed to the point where there may be little distinction left between hardware, software, and/or firmware implementations of aspects of systems; the use of hardware, software, and/or firmware may be generally (but not always, in that in certain contexts the choice between hardware and software may become significant) a design choice representing cost vs. efficiency tradeoffs. Those having skill in the art will appreciate that there may be various vehicles by which processes and/or systems and/or other technologies described herein may be effected (e.g., hardware, software, and/or firmware), and that the preferred vehicle will vary with the context in which the processes and/or systems and/or other technologies may be deployed. For example, if an implementer determines that speed and accuracy may be paramount, the implementer may opt for a mainly hardware and/or firmware vehicle; alternatively, if flexibility may be paramount, the implementer may opt for a mainly software implementation; or, yet again alternatively, the implementer may opt for some combination of hardware, software, and/or firmware. Hence, there may be several possible vehicles by which the processes and/or devices and/or other technologies described herein may be effected, none of which may be inherently superior to the other in that any vehicle to be utilized may be a choice dependent upon the context in which the vehicle will be deployed and the specific concerns (e.g., speed, flexibility, or predictability) of the implementer, any of which may vary. Those skilled in the art will recognize that optical aspects of implementations will typically employ optically oriented hardware, software, and or firmware.

What is claimed is:

1. A computer-implemented method comprising:
   receiving input data from a source;
   applying an interleaving protocol to the input data to generate at least one component codeword;
   decoding the at least one component codeword;
   determining a first convergence value of at least one decoded component codeword;
   computing a bit error count using at least one decoded component codeword;
   computing extrinsic data associated with the at least one component codeword according to the bit error count and the first convergence of at least one component codeword; and
   determining a second convergence value associated with the at least one component codeword according to the extrinsic data associated with the at least one component codeword.

2. The computer-implemented method of claim 1, wherein the input data comprises soft-decision data.

3. The computer-implemented method of claim 1, further comprising:
   applying a de-interleaving protocol to at least one decoded component codeword to generate hard-decision data, and providing the hard-decision data to a hard-decision queue.

4. The computer-implemented method of claim 1, wherein the at least one component codeword comprises:
   log likelihood ratio data.

5. The computer-implemented method of claim 4, further comprises:
   storing the log likelihood ratio data to a 4 k memory, and wherein the applying an interleaving protocol to the input data to generate at least one component codeword includes:
      applying the interleaving protocol to generate at least four component codewords.

6. The computer-implemented method of claim 1, wherein the determining a second convergence value associated with the at least one component codeword according to the extrinsic data associated with the at least one component codeword comprises:
   applying a de-interleaving protocol to the extrinsic data associated with the at least one component codeword.

7. The method of claim 1, further comprising using the first convergence value of the at least one component codeword or using the second convergence value of the at least one component codeword or using both convergence values of the at least one component codeword in a noise-predictive calculation.

8. A computer-implemented system comprising:
   at least one computing device;
   one or more instructions that when implemented in the at least one computing device configure the at least one computing device for:
      receiving input data from a source;
      applying an interleaving protocol to the input data to generate at least one component codeword;
      decoding the at least one component codeword;

determining a first convergence value of at least one decoded component codeword;

computing a bit error count using at least one decoded component codeword;

computing extrinsic data associated with the at least one component codeword according to the bit error count and the first convergence of at least one component codeword; and determining a second convergence value associated with the at least one component codeword according to the extrinsic data associated with the at least one component codeword.

9. The computer-implemented system of claim 8, wherein the input data comprises soft-decision data.

10. The computer-implemented system of claim 8, further comprising:

one or more instructions that when implemented in the at least one computing device configure the at least one computing device to applying a de-interleaving protocol to at least one decoded component codeword to generate hard-decision data; and one or more instructions that when implemented in the at least one computing device configure the at least one computing device to providing the hard-decision data to a hard-decision queue.

11. The computer-implemented system of claim 8, wherein the at least one component codeword comprises:

log likelihood ratio data.

12. The computer-implemented system of claim 11, further comprises:

one or more instructions that when implemented in the at least one computing device configure the at least one computing device to storing the log likelihood ratio data to a 4 k memory, and wherein the applying an interleaving protocol to the input data to generate at least one component codeword includes:

applying the interleaving protocol to generate at least four component codewords.

13. The computer-implemented system of claim 8, wherein the determining a second convergence value associated with the at least one component codeword according to the extrinsic data associated with the at least one component codeword comprises:

one or more instructions that when implemented in the at least one computing device configure the at least one computing device to applying a de-interleaving protocol to the extrinsic data associated with the at least one component codeword.

14. The system of claim 8, the one or more instructions further configured for: using the first convergence value of the at least one component codeword or using the second convergence value of the at least one component codeword or using both convergence values of the at least one component codeword in a noise-predictive calculation.

15. A computer-implemented system comprising:

circuitry for receiving input data from a source;

circuitry for applying an interleaving protocol to the input data to generate at least one component codeword;

circuitry for decoding the at least one component codeword;

circuitry for determining a first convergence value of at least one decoded component codeword;

circuitry for computing a bit error count using at least one decoded component codeword;

circuitry for computing extrinsic data associated with the at least one component codeword according to the bit error count and the first convergence of at least one component codeword; and circuitry for determining a second convergence value associated with the at least one component codeword according to the extrinsic data associated with the at least one component codeword.

16. The computer-implemented system of claim 15, wherein the input data comprises: soft-decision data.

17. The computer-implemented system of claim 15, further comprising:

circuitry for applying a de-interleaving protocol to at least one decoded component to generate hard-decision data; and circuitry for providing the hard-decision data to a hard-decision queue.

18. The computer-implemented system of claim 15, wherein the at least one component codeword comprises:

log likelihood ratio data.

19. The computer-implemented system of claim 18, further comprising:

circuitry for storing the log likelihood ratio data to a 4 k memory, and wherein the circuitry for applying an interleaving protocol to the input data to generate at least one component codeword includes:

circuitry for applying the interleaving protocol to generate at least four component codewords.

20. The computer-implemented system of claim 15, wherein the circuitry for determining a second convergence value associated with the at least one component codeword according to the extrinsic data associated with the at least one component codeword comprises:

circuitry for applying a de-interleaving protocol to the extrinsic data associated with the at least one component codeword.

21. The system of claim 15, further comprising circuitry for using the first convergence value of the at least one component codeword or using the second convergence value of the at least one component codeword or using both convergence values of the at least one component codeword in a noise-predictive calculation.

* * * * *